(12) United States Patent
Kodera

(10) Patent No.: US 7,446,554 B2
(45) Date of Patent: Nov. 4, 2008

(54) DIRECT CURRENT MEASURING APPARATUS AND LIMITING CIRCUIT

(75) Inventor: Satoshi Kodera, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/939,947

(22) Filed: Nov. 14, 2007

(65) Prior Publication Data

US 2008/0111539 A1 May 15, 2008

(30) Foreign Application Priority Data

Nov. 15, 2006 (JP) ............................ 2006-309317
Nov. 8, 2007 (JP) ............................ 2007-290673

(51) Int. Cl.
*G01R 31/26* (2006.01)

(52) U.S. Cl. ...................................... 324/765

(58) Field of Classification Search ........................ None
See application file for complete search history.

(56) References Cited

U.S. PATENT DOCUMENTS 7,068,061 B2 * 6/2006 Tanida et al. ................ 324/765

7,154,291 B2 * 12/2006 Turner ........................ 324/769

FOREIGN PATENT DOCUMENTS

JP 3-183967 A 8/1991

* cited by examiner

*Primary Examiner*—Ernest F. Karlsen
*Assistant Examiner*—Trung Q. Nguyen
(74) *Attorney, Agent, or Firm*—Osha • Liang LLP

(57) ABSTRACT

A direct current measuring apparatus includes a voltage generating part generating a voltage to be applied to a load being a measuring object; a current limiting part limiting a current flowing in the load to a set value; and an output terminal connected to the load. The current limiting part includes a D/A converter, a positive side limiting circuit, a D/A converter and a negative side limiting circuit. The positive side limiting circuit includes a negative feedback loop. The negative feedback loop includes a capacitor and a buffer circuit besides the feedback resistance. An output of the positive side limiting circuit positive side limiting circuit is connected to a non-inverting input terminal of the main amplifier through a diode.

24 Claims, 7 Drawing Sheets

DIRECT CURRENT MEASURING APPARATUS AND LIMITING CIRCUIT

PRIORITY CLAIM

This application claims priority from Japanese Patent Application No. 2006-309317, filed with the Japanese Patent Office on Nov. 15, 2006, and Japanese Patent Application No. 2007-290673, filed with the Japanese Patent Office on Nov. 08, 2007, the contents of which are incorporated herein by reference in its entirety.

BACKGROUND OF THE INVENTION

1. Field of the Invention

The present invention relates to a direct current measuring apparatus, which is applied to a direct current test apparatus such as an IC tester, for applying a desired voltage to a load to measure a current flowing through a load or supplying the load with a desired current to measure a voltage across the load, and in particular, to a direct current measuring apparatus capable of limiting an overcurrent flowing through the load and an overvoltage applied to the load.

2. Description of the Related Art

An example of a conventional direct current measuring apparatus of this type is illustrated in FIG. 7.

This direct current measuring apparatus applies a desired voltage to a load being a measuring object to measure a current flowing in that load and comprises, as illustrated in FIG. 7, a voltage generating part 1 generating a voltage to be applied to a load 4 being a measuring object; a current limiting part 2 limiting a current flowing in the load 4 to a set value; and an output terminal 3 connected to the load 4 (see Japanese Patent Laid-Open No. 3-183967).

The voltage generating part 1 comprises a D/A converter (DAC) 11; a main amplifier 12; an inverter 13, a current sensing resistor 14; a buffer circuit 15; a differential amplifier 16 and the like.

In further detailed description, the D/A converter 11 converts a set voltage value, which is a digital value corresponding to a voltage for generating a set voltage, to an analog voltage corresponding to that value. The main amplifier 12 is configured by an operational amplifier and supplies its non-inverting input terminal (+ input terminal) with an analog voltage output from the D/A converter 11 through a resistance Ri. An inverting input terminal (− input terminal) of the main amplifier 12 is grounded through a resistance Rs. A capacitor Cs is brought into connection between an output terminal and the inverting input terminal of the main amplifier 12.

The output terminal of the main amplifier 12 is connected to the output terminal 3 through the inverter (inverting circuit) 13 and the current sensing resistor 14; and its output terminal 3 is connected to a non-inverting input terminal of the main amplifier 12 through the buffer circuit 15 and a feedback resistance Rf. Accordingly, the main amplifier 12 configures a negative feedback amplifier circuit.

Here, the main amplifier 12 comprises a protection circuit with a diode brought into parallel connection in the mutual opposite directions on its input side.

The current sensing resistor 14 detects a load current (output current) Io flowing in the load 4 and its both ends are connected to an inverting input terminal and a non-inverting input terminal of the differential amplifier 16.

The current limiting part 2 comprises a D/A converter 21, a positive side limiting circuit 22, a D/A converter 23 and a negative side limiting circuit 24.

In further detailed description, the D/A converter 21 generates a positive voltage derived by multiplying a current-limit value to be set on the positive side with a resistance value of the current sensing resistor 14 to output this positive voltage.

The positive side limiting circuit 22 is configured, as illustrated in FIG. 7, by an operational amplifier 221; an input resistance R1$p$ and R2$p$; a diode D1$p$; and a feedback resistance R3$p$.

The inverting input terminal of the operational amplifier 221 is supplied with an output voltage of the D/A converter 21 through the input resistance R1$p$; and is supplied with an output voltage of the differential amplifier 16 through the input resistance R2$p$. The non-inverting input terminal of the operational amplifier 221 is grounded. An output terminal of the operational amplifier 221 is connected to a non-inverting input terminal of the main amplifier 12 through the diode D1$p$. In addition, an output terminal of the operational amplifier 221 is connected to an inverting input terminal of the operational amplifier 221 through the diode D1$p$ and the feedback resistance R3$p$.

The D/A converter 23 generates a negative voltage derived by multiplying a current-limit value to be set on the negative side with a resistance value of the current sensing resistor 14 to output this negative voltage.

The negative side limiting circuit 24 is configured, as illustrated in FIG. 7, by an operational amplifier 241; an input resistance R1$n$ and R2$n$; a diode D1$n$; and a feedback resistance R3$n$.

The inverting input terminal of the operational amplifier 241 is supplied with an output voltage of the D/A converter 23 through the input resistance R1$n$; and is supplied with an output voltage of the differential amplifier 16 through the input resistance R2$n$. The non-inverting input terminal of the operational amplifier 241 is grounded. An output terminal of the operational amplifier 241 is connected to a non-inverting input terminal of the main amplifier 12 through the diode D1$n$. In addition, an output terminal of the operational amplifier 241 is connected to an inverting input terminal of the operational amplifier 241 through the diode D1$n$ and the feedback resistance R3$n$.

Next, an operation example of such a conventional apparatus will be described with reference to FIG. 7.

At first, the case where the voltage generating part 1 applies a desired voltage to the load 4 to measure a current flowing in the load 4 will be described.

In that case, the main amplifier 12 operates so that an output voltage Vout of the output terminal 3 is equal to the set voltage of a set voltage value being set in the input of the D/A converter 11. That set voltage is applied to the load 4. At that time, a load current Io flowing in the load 4 flows in the current sensing resistor 14. A voltage corresponding to the load current Io occurs in the both ends of the current sensing resistor 14. There, the differential amplifier 16 takes out a voltage corresponding to the size of the load current Io. That voltage is converted to a digital value with an A/D converter (not illustrated in the drawing). The load current Io is displayed on an indicator and the like not illustrated in the drawing based on a digital value thereof.

Next, operations of the current limiting part 2 in the case where the load 4 is an IC (integrated circuit), for example, and the IC is out of order will be described.

Here, when the load current Io flowing toward the load 4 becomes an overcurrent and the absolute value of the negative output voltage of the differential amplifier 16 gets larger than the positive output voltage of the D/A converter 21, the output voltage of the operational amplifier 221 of the positive side limiting circuit 22 becomes a positive voltage. That positive voltage is negatively fed back to the inverting input terminal of the operational amplifier 221 through the reverse-current preventing diode D1p and, moreover, through the negative feedback resistance R3p and current limiting part 2 operates so that the voltage of that inverting input terminal becomes zero.

A positive voltage corresponding to the difference between the output voltage of the differential amplifier 16 and the output voltage of the D/A converter 21 appears at a common connection point of the diode D1p and the negative feedback resistance R3p. That positive voltage is applied to the non-inverting input terminal of the main amplifier 12. Therefore, the output voltage of the inverter 13, that is, the output voltage Vout of the output terminal 3 drops to operate so that the absolute value of the output voltage of the differential amplifier 16 is equal to the output voltage of the D/A converter 21. The load current Io is limited (clamped) to a positive current-limit value set in the D/A converter 21.

On the other hand, when the load current Io becomes an overcurrent in the case of heading for the side of the inverter 13, the negative side limiting circuit 24 operates likewise. The load current Io is limited to a negative current-limit value set in the D/A converter 23.

FIGS. 8A-8C are waveform diagrams that illustrate an example of deteriorated settling property in a conventional apparatus. FIG. 8A is a waveform diagram for an output voltage on the D/A converter 11 in the conventional apparatus. FIG. 8B is a waveform diagram of the Vout in the conventional apparatus when a limit value set is large. FIG. 8C is a waveform diagram of the Vout in the conventional apparatus when a limit value set is small.

In the conventional apparatus, in the case where the output voltage of the D/A converter 11 changes as illustrated in FIG. 8A and the output voltage Vout of the output terminal 3 changes corresponding thereto, the level of the positive and negative output voltages corresponding to the positive and negative current-limit values output from the D/A converters 21 and 23 gives rise to a defect that a difference in settling time of the output voltage Vout of the voltage generating part 1 (see FIGS. 8B and 8C) arises.

For example, the positive side limiting circuit 22 can be limited at the time of Vs>Vax(-R3p/R1p) with Vs being the voltage of the non-inverting input terminal of the main amplifier 12 and Va being a positive output voltage of the D/A converter 21 and, when that value (Vax(-R3p/R1p)) exceeds the potential Vs, the positive side limiting circuit 22 will be brought into an operation.

Consequently, in the case where the limit voltage of the positive side limiting circuit 22 is low, the limit voltage value drops corresponding thereto and the slew rate (settling time) of the output voltage Vout gets long compared with the case where the limit voltage is high (see FIGS. 8B and 8C).

Here, the maximum slew rate SR of the main amplifier 12 in FIG. 7 can be expressed by the following expression (1):

$$SR=Vs/Rs/Cs \qquad (1)$$

In addition, voltage settling indicative of a transient response of the output for the input of the main amplifier 12 gets worse on the following points when the voltage generating part 1 generates a voltage.

It is general that the load 4 is connected with a bypass capacitor CL in parallel.

FIGS. 9A-9C are waveform diagrams that illustrate an example of deteriorated settling property in a conventional apparatus. FIG. 9A is a waveform diagram for an output voltage on the D/A converter 11 in the conventional apparatus. FIG. 9B is a waveform diagram of the Vout in the conventional apparatus. FIG. 9C is a waveform diagram of a load current in the conventional apparatus.

In that case, the output voltage of the D/A converter 11 changes as illustrated in FIG. 9A. When this changes the output voltage Vout (see FIG. 9B), a current flows in the capacitor CL besides the load 4.

In the case where a current is supplied during settling, the following limitation gets effective with Vb being an output voltage of the differential amplifier 16:

$$Vs>\{Vax(-R3p/R1p)+Vbx(-R3p/R2p)\}$$

Due to that limitation, the limitation will be applied at an output current lower than an actually determined limit value (see FIG. 9C). Accordingly, the positive side limiting circuit 22 carries out a current limiting operation at the time of a current lower than the set current-limit value, giving rise, therefore, to a defect that settling of the output voltage Vout gets worse (see FIG. 9B).

Accordingly, in the conventional apparatus, at the occasion when a voltage generating part generates a desired voltage, settling performance occasionally gets worse due to the set limit value of the current set in the current limiting part. That case is not preferable for making direct-current test faster and more accurate.

For the foregoing reasons, there is a need for a direct current measuring apparatus that can improve settling performance when measuring a signal level such as a current due to a set limit value of the signal to carry out speeding up and higher accuracy.

There is another need for a limiting circuit that can help the direct current measuring apparatus achieve its need.

SUMMARY OF THE INVENTION

The present invention is directed to a direct current measuring apparatus and a limiting circuit that satisfy these needs.

A first aspect of the invention comprises a first D/A converter outputting a voltage corresponding to a set voltage; a main amplifier generating the set voltage based on an output voltage of the first D/A converter to supply a load with the set voltage; a differential amplifier generating and outputting a voltage corresponding to a current flowing in the load; a second D/A converter generating and outputting a voltage corresponding to a predetermined limit current flowing in the load; and a limiting circuit amplifying a difference between an output voltage of the differential amplifier and an output voltage of the second D/A converter and feeding back the difference to an input side of the main amplifier through a diode, wherein the limiting circuit includes a negative feedback loop including a feedback resistance and the negative feedback loop includes either a capacitor or a buffer circuit on an output side of the limiting circuit.

Preferably, the negative feedback loop of the limiting circuit includes, in the first aspect of the invention, both of a capacitor and a buffer circuit on an output side of the limiting circuit.

Preferably, the diode in the limiting circuit is configured, in the first or second aspect of the invention, by a first diode forming a part of the negative feedback loop and a second diode taking out an output of the limiting circuit.

Preferably, the direct current measuring apparatus further comprises a resistor between the main amplifier and the buffer circuit.

A second aspect of the invention comprises a first D/A converter outputting a voltage corresponding to a set voltage; a main amplifier generating the set voltage based on an output voltage of the first D/A converter to supply a load with the set voltage; a differential amplifier generating and outputting a voltage corresponding to a current flowing in the load; a second D/A converter and a third D/A converter generating and outputting a positive and negative voltage corresponding to a predetermined positive and negative limit current flowing in the load; a first limiting circuit amplifying a difference between an output voltage of the differential amplifier and a positive output voltage of the second D/A converter and feeding back the difference to an input side of the main amplifier through a diode; and a second limiting circuit amplifying a difference between an output voltage of the differential amplifier and a negative output voltage of the third D/A converter and feeding back the difference to an input side of the main amplifier through a diode, wherein, the first and second limiting circuit includes a first and a second negative feedback loop including a feedback resistance and the respective negative feedback loops include either a common capacitor or a common buffer circuit on an output side of each of the limiting circuits.

A third aspect of the invention comprises a first D/A converter outputting a voltage corresponding to a set voltage; a main amplifier generating the set voltage based on an output voltage of the first D/A converter to supply a load with the set voltage; a differential amplifier generating and outputting a voltage corresponding to a current flowing in the load; a second D/A converter and a third D/A converter generating and outputting a positive and negative voltage corresponding to a predetermined positive and negative limit current flowing in the load; a first limiting circuit amplifying a difference between an output voltage of the differential amplifier and a positive output voltage of the second D/A converter and feeding back the difference to an input side of the main amplifier through a diode; and a second limiting circuit amplifying a difference between an output voltage of the differential amplifier and a negative output voltage of the third D/A converter and feeding back the difference to an input side of the main amplifier through a diode, wherein, the first and second limiting circuit includes a first and a second negative feedback loop including a feedback resistance; and the respective negative feedback loops include either an independent capacitor or an independent buffer circuit on an output side of each of the limiting circuits or include both of an independent capacitor and an independent buffer circuit on an output side of each of the limiting circuits.

Preferably, the diode in the first limiting circuit is configured by a first diode forming a part of the first negative feedback loop and a second diode taking out an output of the first limiting circuit; the diode in the second limiting circuit is configured by a third diode forming a part of the second negative feedback loop and a fourth diode taking out an output of the second limiting circuit; and the third and the fourth diode are used in common.

Preferably, the direct current measuring apparatus further comprises a resistor between the main amplifier and the buffer circuit.

A fourth aspect of the invention comprises a first D/A converter outputting a voltage corresponding to a set current; a main amplifier generating the set current based on an output voltage of the first D/A converter to supply a load with the set current; a voltage detecting circuit detecting a voltage of the load; a second D/A converter generating and outputting a predetermined limit voltage supplied to the load; and a limiting circuit amplifying a difference between a detection voltage of the voltage detecting circuit and an output voltage of the second D/A converter and feeding the difference to an input side of the main amplifier through a diode, wherein the limiting circuit includes a negative feedback loop including a feedback resistance and the negative feedback loop includes either a capacitor or a buffer circuit on an output side of the limiting circuit.

Preferably, a negative feedback loop of the limiting circuit includes both of a capacitor and a buffer circuit on an output side of the limiting circuit.

Preferably, the diode in the limiting circuit is configured by a first diode forming a part of the negative feedback loop and a second diode taking out an out put of the limiting circuit.

Preferably, the direct current measuring apparatus further comprises a resistor between the main amplifier and the buffer circuit.

A fifth aspect of the invention comprises a first D/A converter outputting a voltage corresponding to a set voltage; a main amplifier generating the set voltage based on an output voltage of the first D/A converter to supply a load with the set voltage; a voltage detecting circuit detecting a voltage of the load, a second D/A converter and a third D/A converter respectively generating and outputting a positive and negative voltage as a predetermined limit voltage supplied to the load; a first limiting circuit amplifying a difference between a detection of the voltage detecting circuit and a positive output voltage of the second D/A converter and feeding back the difference to an input side of the main amplifier through a diode; and a second limiting circuit amplifying a difference between a detection of the voltage detecting circuit and a negative output voltage of the third D/A converter and feeding back the difference to an input side of the main amplifier through a diode, wherein the first and second limiting circuit includes a first and a second negative feedback loop including a feedback resistance and the respective negative feedback loops include either a common capacitor or a common buffer circuit on an output side of each of the limiting circuits.

A sixth aspect of the invention comprises a first D/A converter outputting a voltage corresponding to a set voltage; a main amplifier generating the set voltage based on an output voltage of the first D/A converter to supply a load with the set voltage; a voltage detecting circuit detecting a voltage of the load; a second D/A converter and a third D/A converter respectively generating and outputting a positive and negative voltage as a predetermined limit voltage supplied to the load; a first limiting circuit amplifying a difference between a detection of the voltage detecting circuit and a positive output voltage of the second D/A converter and feeding back the difference to an input side of the main amplifier through a diode; and a second limiting circuit amplifying a difference between a detection of the voltage detecting circuit and a negative output voltage of the third D/A converter and feeding back the difference to an input side of the main amplifier through a diode, wherein the first and second limiting circuit includes a first and a second negative feedback loop including a feedback resistance; and the respective negative feedback loops include either an independent capacitor or an independent buffer circuit on an output side of each of the limiting circuits or include both of an independent capacitor and an independent buffer circuit on an output side of each of the limiting circuits.

Preferably, the diode in the first limiting circuit is configured by a first diode forming a part of the first negative feedback loop and a second diode taking out an output of the first limiting circuit; the diode in the second limiting circuit is configured by a third diode forming a part of the second negative feedback loop and a fourth diode taking out an output of the second limiting circuit; and the third and the fourth diode are used in common.

Preferably, the direct current measuring apparatus further comprises a resistor between the main amplifier and the buffer circuit.

A seventh aspect of the invention is a limiting circuit used in a current measuring apparatus applying a predetermined voltage to a load to measure a current of the load, comprising: an operational amplifier; and a negative feedback loop provided between an output terminal of the operational amplifier and a non-inverting input terminal and including a first diode and feedback resistance, wherein a limit voltage corresponding to a limit current of the load and a detection voltage obtained corresponding to a current flowing in the load are input to the operational amplifier and the negative feedback loop includes either a capacitor or a buffer circuit on an output side of the operational amplifier.

Preferably, the negative feedback loop includes both of a capacitor and a buffer circuit on an output side of the operational amplifier.

Preferably, an output of the operational amplifier is taken out through a second diode.

Preferably, the limiting circuit further comprises a resistor connected to an input of the buffer circuit.

DETAILED DESCRIPTION OF THE INVENTION

Embodiments of the present invention will be described with reference to the drawings below.

First Embodiment

Figure 1:
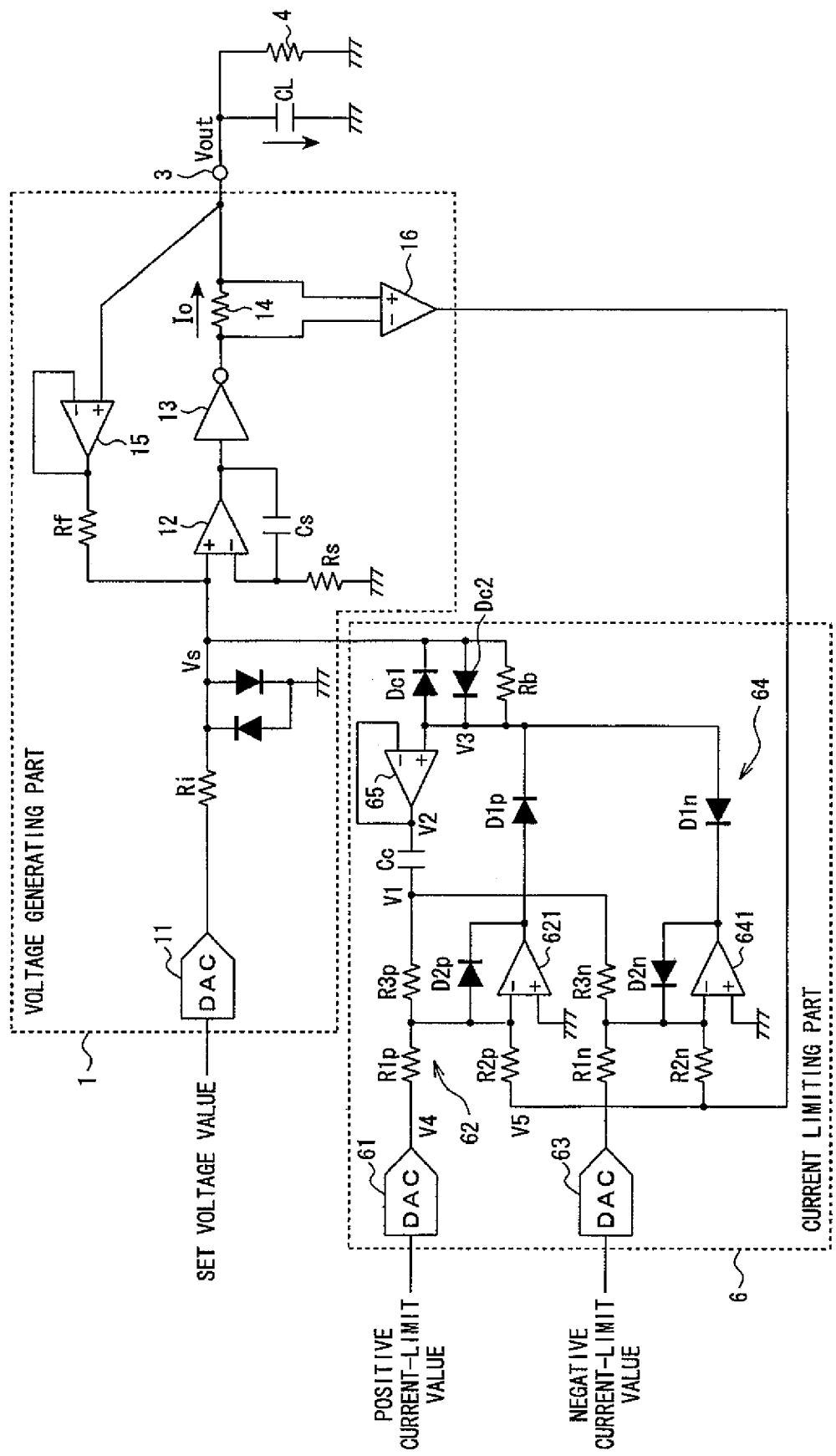
FIG. 1 is a circuit diagram illustrating a configuration of a first embodiment of a current measuring apparatus in accordance with the invention.

A first embodiment related to a direct current measuring apparatus applies a desired voltage to a load being a measuring object to measure a current flowing in that load and comprises, as illustrated in FIG. 1, a voltage generating part 1 generating a voltage to be applied to a load 4 being a measuring object; a current limiting part 6 limiting a current flowing in the load 4 to a set value; and an output terminal 3 connected to the load 4.

The voltage generating part 1 comprises a D/A converter 11; a main amplifier 12; an inverter 13, a current sensing resistor 14; a buffer circuit 15; a differential amplifier 16 and the like. Here, respective components of that voltage generating part 1 is basically the same as the respective components designated with likewise characters in the voltage generating part 1 illustrated in FIG. 7 in configuration thereof.

The current limiting part 6 comprises a D/A converter 61, a positive side limiting circuit 62, a D/A converter 63 and a negative side limiting circuit 64. Here, the positive side limiting circuit 62 and the negative side limiting circuit 64 correspond to the limiting circuit of the present invention.

In further detailed description, the D/A converter 61 generates a positive voltage derived by multiplying a current limitation value to be set on the positive side with a resistance value of the current sensing resistor 14 to output this positive voltage.

The positive side limiting circuit 62 amplifies a voltage of a difference between the output voltage of the differential amplifier 16 and an output voltage of the D/A converter 61; feeds this voltage to the non-inverting input terminal of the main amplifier 12 through the diode D1$p$ and the diode Dc1; and limits a current flowing in the load 4 to a positive current-limit value.

Therefore, the positive side limiting circuit 62 is configured, as illustrated in FIG. 1, by an operational amplifier 621; an input resistance R1$p$ and R2$p$; a diode D1$p$ for preventing reverse currents; and a feedback resistance R3$p$; a capacitor Cc for shielding direct currents; a buffer circuit 65 with high input impedance; and a diode Dc1. Here, in the positive side limiting circuit 62, the diode D2$p$ can be omitted.

The inverting input terminal of the operational amplifier 621 is supplied with an output voltage V4 of the D/A converter 61 through the input resistance R1$p$; and is supplied with an output voltage V5 of the differential amplifier 16 through the input resistance R2$p$. The non-inverting input terminal of the operational amplifier 621 is grounded.

An output terminal of the operational amplifier 621 is connected to a non-inverting input terminal of the main amplifier 12 through the diode D1$p$ and the diode Dc1. In addition, an output terminal of the operational amplifier 621 is connected to an inverting input terminal of the operational amplifier 621 through the diode D1$p$, the buffer circuit 65, the capacitor Cc and the feedback resistance R3$p$. Accordingly, the positive side limiting circuit 62 includes a negative feedback loop (negative feedback loop circuit). The negative feedback loop includes a capacitor Cc and a buffer circuit 65 besides the feedback resistance R3$p$.

The D/A converter 63 generates a negative voltage derived by multiplying a current limitation value to be set on the negative side with a resistance value of the current sensing resistor 14 to output this negative voltage.

The negative side limiting circuit 64 amplifies a voltage of a difference between the output voltage of the differential amplifier 16 and an output voltage of the D/A converter 63; feeds this voltage to the non-inverting input terminal of the main amplifier 12 through the diode D1n and the diode Dc2; and limits a current flowing in the load 4 to a negative current-limit value.

Therefore, the negative side limiting circuit 64 is configured, as illustrated in FIG. 1, by an operational amplifier 641; an input resistance R1n and R2n; a diode D1n for preventing reverse currents; and a feedback resistance R3n; a capacitor Cc for shielding direct currents; a buffer circuit 65 with high input impedance; and a diode Dc2. Here, in the negative side limiting circuit 64, the diode D2n can be omitted.

The inverting input terminal of the operational amplifier 641 is supplied with an output voltage of the D/A converter 63 through the input resistance R1n; and is supplied with an output voltage of the differential amplifier 16 through the input resistance R2n. The non-inverting input terminal of the operational amplifier 641 is grounded.

An output terminal of the operational amplifier 641 is connected to a non-inverting input terminal of the main amplifier 12 through the diode D1n and the diode Dc2. In addition, an output terminal of the operational amplifier 641 is connected to an inverting input terminal of the operational amplifier 641 through the diode D1n, the buffer circuit 65, the capacitor Cc and the feedback resistance R3n. Accordingly, the negative side limiting circuit 64 includes a negative feedback loop. The negative feedback loop includes a capacitor Cc and a buffer circuit 65 besides the feedback resistance R3n.

Here, the non-inverting input terminal of the buffer circuit 65 is connected to a non-inverting input terminal of the main amplifier 12 with resistance Rb made of, for example, high resistance. The resistance Rb is intended to fix a potential of the non-inverting input terminal of the buffer circuit 65 at a predetermined potential so as not to become unknown when the limiting circuits 62 and 64 do not perform limiting operations.

Here, either the positive side limiting circuit 62 or the negative side limiting circuit 64 operates. Therefore, the positive side limiting circuit 62 and the negative side limiting circuit 64 include the capacitor Cc and the buffer circuit 65 in common inside the negative feedback loop circuit.

Next, an operation example of the thus configured first embodiment will be described with reference to the drawings.

Figure 7:
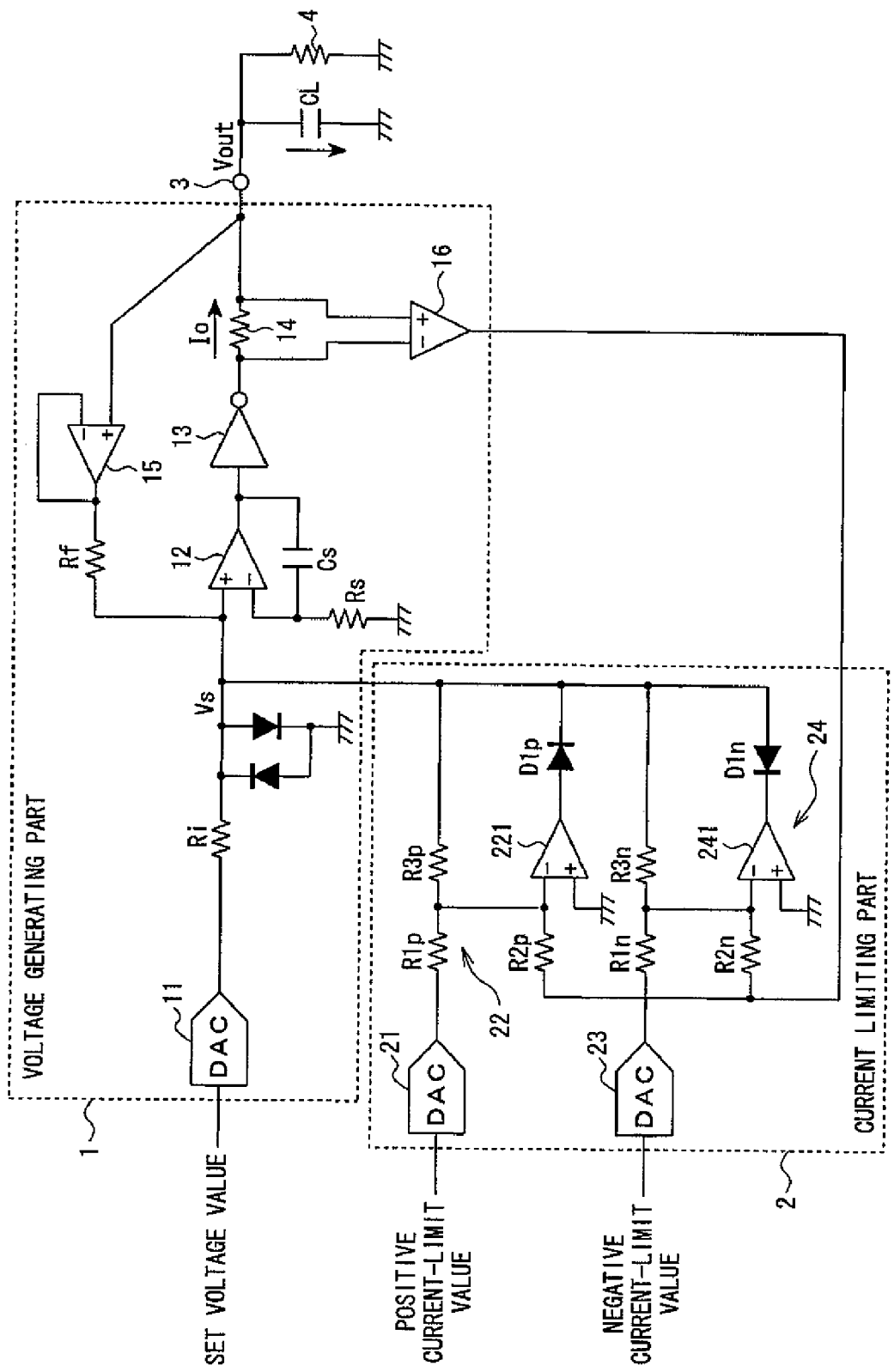
FIG. 7 is a circuit diagram illustrating a configuration of a conventional apparatus.
Figure 8:
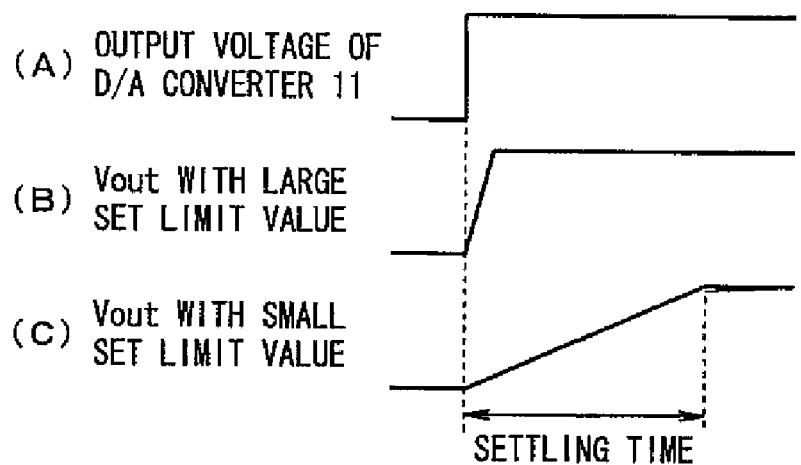
FIG. 8A is a waveform diagram for an output voltage on the D/A converter 11 in a conventional apparatus.
FIG. 8B is a waveform diagram of the Vout in the conventional apparatus when a limit value set is large.
FIG. 8C is a waveform diagram of the Vout in the conventional apparatus when a limit value set is small.
Figure 9:
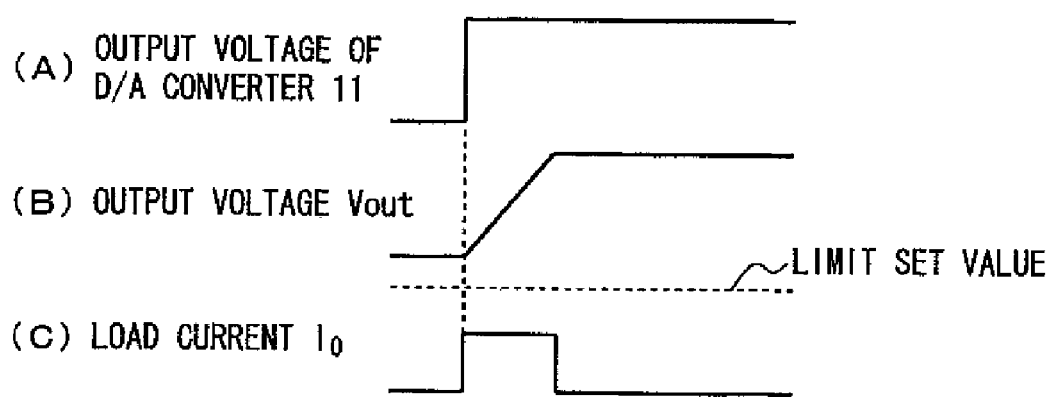
FIG. 9A is a waveform diagram for an output voltage on the D/A converter 11 in the conventional apparatus.
FIG. 9B is a waveform diagram of the Vout in the conventional apparatus.
FIG. 9C is a waveform diagram of a load current in the conventional apparatus.

At first, the operation in the case where the voltage generating part 1 applies a desired voltage to the load 4 to measure a current flowing in the load 4 is likewise the case in FIG. 7. Therefore, description thereof will be omitted.

Next, operations of the current limiting part 6 in the case where the load 4 such as an IC is out of order and the current flowing in the load 4 is an overcurrent will be described.

Here, when the load current Io flowing toward the load 4 becomes an overcurrent and the absolute value of the negative output voltage of the differential amplifier 16 gets larger than the positive output voltage of the D/A converter 61, the output voltage of the operational amplifier 621 of the positive side limiting circuit 62 becomes a positive voltage. That positive voltage is negatively fed back to the inverting input terminal of the operational amplifier 621 through the diode D1p and, moreover, through the buffer circuit 65, the capacitor Cc and the negative feedback resistance R3p so that the voltage of that inverting input terminal becomes zero.

A positive voltage corresponding to the difference between the output voltage of the differential amplifier 16 and the output voltage of the D/A converter 61 appears at a common connection point of the diode D1p and the non-inverting input terminal of the buffer circuit 65. That positive voltage is applied to the non-inverting input terminal of the main amplifier 12 through the diode Dc1. Therefore, the output voltage of the inverter 13, that is, the output voltage Vout of the output terminal 3 drops to operate so that the absolute value of the output voltage of the differential amplifier 16 is equal to the output voltage of the D/A converter 61. The load current Io is limited (clamped) to a positive current-limit value set in the D/A converter 61.

On the other hand, the load current Io becomes an overcurrent in the case of heading for the side of the inverter 13. Then the negative side limiting circuit 64 operates likewise. The load current Io is limited to a negative current-limit value set in the D/A converter 63.

Figure 2:
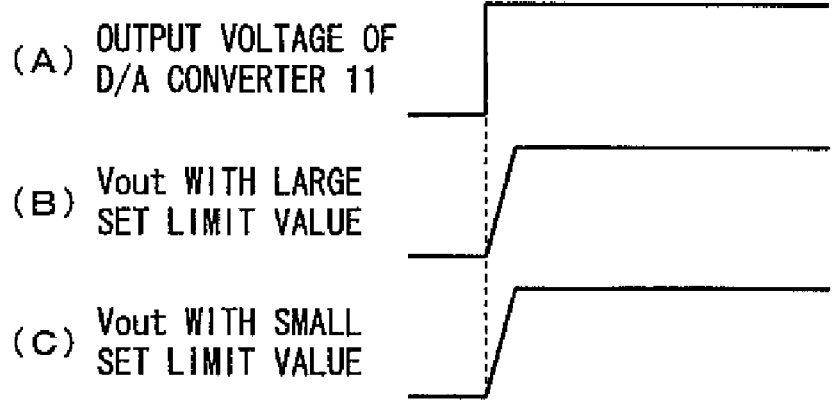
FIG. 2A is a waveform diagram for an output voltage on the D/A converter 11 in a first embodiment in accordance with the invention.
FIG. 2B is a waveform diagram of the Vout in the first embodiment when a limit value set is large.
FIG. 2C is a waveform diagram of the Vout in the first embodiment when a limit value set is small.

FIGS. 2A-2C are a waveform diagram of each part for describing an example of improved settling property in the first embodiment. FIG. 2A is a waveform diagram for an output voltage on the D/A converter 11 in the first embodiment. FIG. 2B is a waveform diagram of the Vout in the first embodiment when a limit value set is large. FIG. 2C is a waveform diagram of the Vout in the first embodiment when a limit value set is small.

Next, in that first embodiment, in the case where the output voltage of the D/A converter 11 changes as illustrated in FIG. 2A, the output voltage Vout of the output terminal 3 changes as illustrated in FIG. 2C and the slew rate of the voltage generating part 1 is improved in the case where the current-limit value set in the current limiting part 6 is small. Therefore, that point will be described with the operations on the side of the positive side limiting circuit 62 as an example.

Also in the first embodiment hereof, the maximum slew rate SR can be expressed by the above described expression (1) $SR=V_s/R_s/C_s$. When the maximum slew rate is exerted, the potential Vs of the non-inverting input terminal of the main amplifier 12 establishes $V_s=-V_F$. Here, the voltage VF is a forward voltage drop in the diode Dc1.

In the positive side limiting circuit 62, the potential V1 at the connection point of the feedback resistance R3p and the capacitor Cc is limited by $V4\times(-R3p/R1p)$. Here, the voltage V4 is an output voltage of the D/A converter 61 and corresponds to the positive current-limit value.

Therefore, when the potential V1 establishes the relation of V1>V2, the positive side limiting circuit 62 will operate. Thereby, the voltage Vs of the non-inverting input terminal of the main amplifier 12 is limited. Consequently, the slew rate of the above described output voltage Vout is limited. Here, the voltage V2 is a potential of the output terminal of the buffer circuit 65 and is equivalent to the potential V3 of the non-inverting input terminal of that buffer circuit 65.

Here, in order not to allow the positive side limiting circuit 62 to operate while that slew rate is being generated, the relation of V1<V2 always needs to be fulfilled.

In the case where the diode Dc1 is not present, the value of the output voltage V4 of the D/A converter 61 occasionally establishes V1>V2. However, in the case where the diode Dc1 is present, in the case where the positive side limiting circuit 62 is about to operate, the diode D1p is about to be put on. Then, with the forward voltage drop VF of that diode Dc1, the potential V3 of the non-inverting input terminal of the buffer circuit 65 establishes V3=Vs+VF and increases by only the portion of the forward voltage drop VF. Therefore, unless the limiting range $(0-V4\times(-R3p/R1p))$ of the potential Vs due to the output voltage of the D/A converter 61 exceeds V3=Vs+VF, the positive side limiting circuit 62 does not operates.

The above described description is on an example of the side of the positive side limiting circuit 62. However, those operations are likewise the case of the side of the negative side limiting circuit 64 as well.

Accordingly, in the first embodiment hereof, in the case of not exceeding the set current-limit value of the D/A converters 61 and 63, regardless of the level of the set current-limit value, that is, the level of the output voltage of the D/A converters 61 and 63, the slew rate of the voltage generating part 1 does not change but will remain the same.

Therefore, according to the first embodiment hereof, the output voltage Vout of the voltage generating part 1 will be as illustrated in FIG. 2C in the case where the set current-limit values of the D/A converters 61 and 63 are small. It is apparent that the slew rate is improved compared with conventional cases in the case of small current-limit values.

Figure 3:
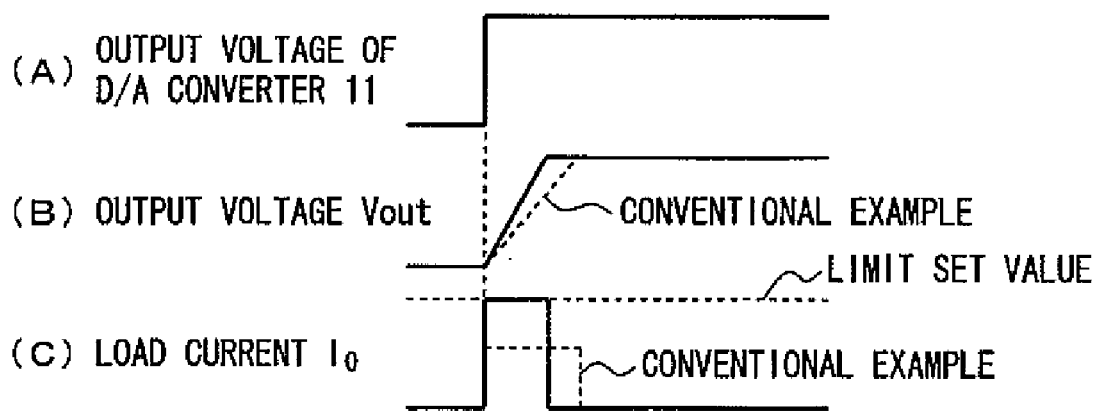
FIG. 3A is a waveform diagram of the output voltage of the D/A converter 11 in the first embodiment in accordance with the invention.
FIG. 3B is a waveform diagram of the output voltage Vout.
FIG. 3C is a waveform diagram of the load current Io.

FIGS. 3A-3C are a waveform diagram of each part for describing another example of improved settling property in the first embodiment. FIG. 3A is a waveform diagram of the output voltage of the D/A converter 11. FIG. 3B is a waveform diagram of the output voltage Vout. FIG. 3C is a waveform diagram of the load current Io.

Next, operations in the case where the output voltage of the D/A converter 11 changes as illustrated in FIG. 3A in the first embodiment hereof, and the load 4 is connected to the output terminal 3 at that time or the load 4 includes a capacitor CL at that time will be described.

In that case, as the output voltage of that D/A converter 11 changes, the output voltage Vout of the output terminal 3 changes as in FIG. 3B and a slew rate is present. According to this, the load current Io flows in the current sensing resistor 14. Thereby the output voltage of the differential amplifier 16 will be V5. The positive side limiting circuit 62 tries to operate with voltage comparison between the output voltage V4 of the D/A converter 61 and the output voltage v5 of the differential amplifier 16.

However, the positive side limiting circuit 62 includes a buffer circuit 65 and a capacitor Cc inside its negative feedback loop. Therefore, even when the potential Vs arises in the non-inverting input terminal of the main amplifier 12 during occurrence of slew rate, an occurrence of current in the feedback resistance R3p due to that potential Vs can be prevented.

Therefore, the current limit of the positive side limiting circuit 62 is determined only by the resistance R1p and R2p, the output voltage V4 of the D/A converter 61 corresponding to the set current-limit value and the output voltage (with the load current Io) of the differential amplifier 16.

Accordingly, even if the load current Io as illustrated in FIG. 3C flows during occurrence (during settling) of slew rate, the positive side limiting circuit 62 does not carry out current-limit operations as far as its load current Io does not exceed the set current-limit value. Those situations are likewise present in the D/A converter 63 and the side of the negative side limiting circuit 64.

Therefore, in the first embodiment hereof, during the occurrence of slew rate, in the case where the current-limit value of the current limiting part 6 is not more than a set value, current limiting operations as in the conventional case do not take place to give rise to a waveform as in FIG. 3B to plan an improvement in slew rate.

Next, typical configurations of the first embodiment and the accompanying operations and effects will be summarized as follows.

(1) In the first embodiment, the positive side limiting circuit 62 and the negative side limiting circuit 64 includes the capacitor Cc for shielding direct currents inside their respective negative feedback loops. Therefore, when the output voltage Vout gives rise to a slew rate due to a change in output voltage of the D/A converter 11, the potential Vs of the non-inverting input terminal of the main amplifier 12 will not be influenced by the output voltage corresponding to the set current-limit values of the D/A converters 61 and 63. Therefore, according to the first embodiment, the gains of the positive side limiting circuit 62 and the negative side limiting circuit 64 can be enhanced to enable realization of faster and more accurate current limiting operations.

(2) In addition, in the first embodiment, the positive side limiting circuit 62 and the negative side limiting circuit 64 are respectively provided with a buffer circuit 65 inside their negative feedback loops and thereby no current flows in the negative feedback loops. Therefore, according to the first embodiment, respective input impedances of the positive side limiting circuit 62 and the negative side limiting circuit 64 can be improved equivalently. Thereby, attenuation of the feedback amount of the voltage generating part 1 can be prevented. Consequently, frequency properties of the voltage generating part 1 are improved so that an improvement in settling property can be planned.

(3) Moreover, in the first embodiment, the positive side limiting circuit 62 and the negative side limiting circuit 64 respectively supply the non-inverting input terminal of the main amplifier 12 with their respective output voltages through the diodes Dc1 and Dc2. Therefore, in the first embodiment, during an occurrence of a slew rate, the current (sink current at the time of the positive voltage slew rate and source current at the time of the negative voltage slew rate) flowing in the non-inverting input terminal of the buffer circuit 65 is prevented so that the positive side limiting circuit 62 and the negative side limiting circuit 64 do not carry out the current limiting operations. Accordingly, since the first embodiment does not carry out current limiting operations in the case where the load current Io does not exceed the set current-limit value, voltage settling does not change but becomes the same regardless of the level of the set current-limit value.

(4) Here, in the first embodiment, each of the negative feedback loops of the limiting circuits 62 and 64 include the capacitor Cc and the buffer circuit 65 and, moreover, the outputs of the limiting circuits 62 and 64 are taken out through the diodes Dc1 and Dc2.

However, the present invention does not have to include all of those configurations but can preferably include at least one of those configurations or can be a combination of the capacitor Cc and the buffer circuit 65, a combination of the capacitor Cc and the diodes Dc1 and Dc2 and the like. Those points will be likewise in the cases of the following respective embodiments.

Second Embodiment

In the first embodiment illustrated in FIG. 1, either the positive side limiting circuit 62 or the negative side limiting circuit 64 does not operate so that no concurrent operation takes place. Therefore, each negative feedback loop of the positive side limiting circuit 62 and the negative side limiting circuit 64 includes the capacitor Cc in common.

However, in that case, the capacitor Cc is included in common. Therefore, the respective properties of the positive side limiting circuit 62 and the negative side limiting circuit 64 cannot be made different with the value of the capacitor Cc.

Figure 4:
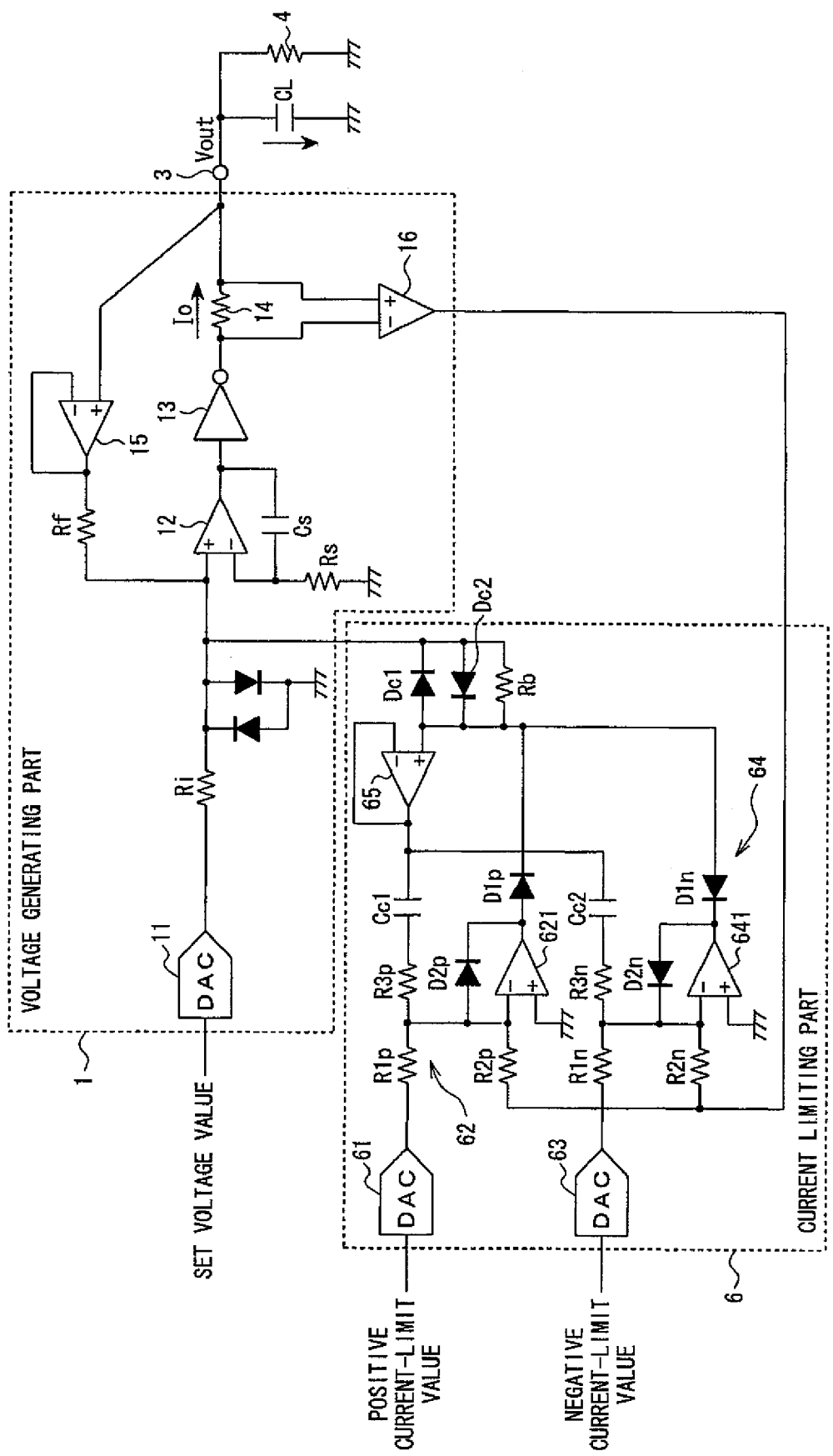
FIG. 4 is a circuit diagram illustrating a configuration of a second embodiment of a current measuring apparatus in accordance with the invention.

Therefore, a second embodiment related to the measuring apparatus of the present invention is basically configured likewise the first embodiment illustrated in FIG. 1 and is designed, as illustrated in FIG. 4, so that respectively negative feedback loops of the positive side limiting circuit 62 and the negative side limiting circuit 64 include the capacitors Cc1 and Cc2 independently and the positive side limiting circuit 62 and the negative side limiting circuit 64 can obtain respectively arbitrary properties with capacitance values of the capacitors Cc1 and Cc2 based on necessity.

That is, the negative feedback loop of the positive side limiting circuit 62 includes an independent capacitor Cc1 besides the feedback resistance R3p. One end side of the capacitor Cc1 is connected to the feedback resistance R3p and the other end side is connected to an output terminal of the buffer circuit 65. In addition, the negative feedback loop of the negative side limiting circuit 64 includes an independent capacitor Cc2 besides the feedback resistance R3n. One end side of the capacitor Cc2 is connected to the feedback resistance R3n and the other end side is connected to an output terminal of the buffer circuit 65.

Here, in the second embodiment hereof, the configuration of the other portions except the above described configuration is likewise the configuration of the first embodiment in FIG. 1. Therefore, like reference characters are caused to designate the same or similar components throughout the drawing and description of the detailed description thereon will be omitted.

According to the thus configured second embodiment, a likewise operations and effects of the first embodiment can be realized.

Third Embodiment

Figure 5:
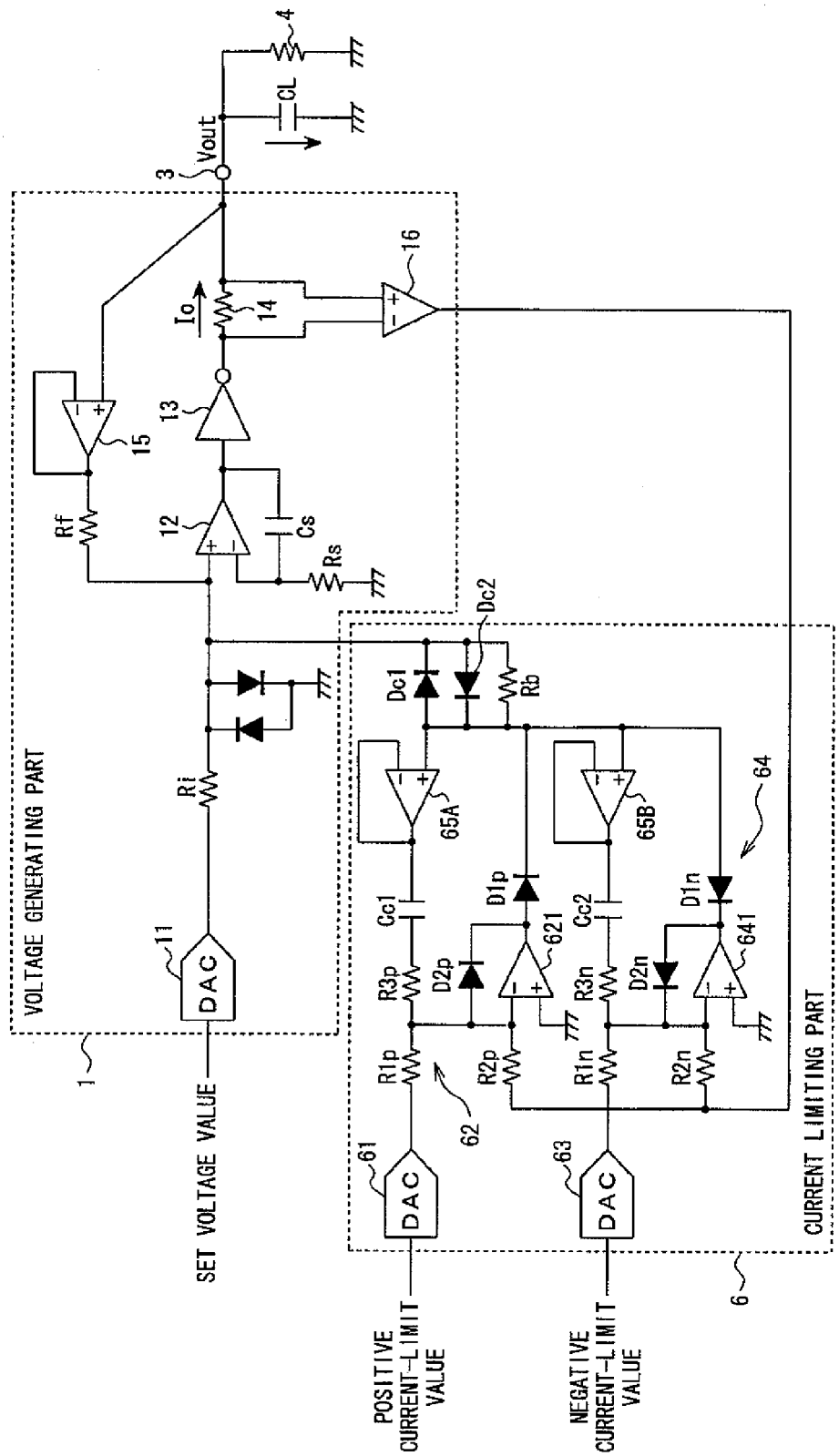
FIG. 5 is a circuit diagram illustrating a configuration of a third embodiment of a current measuring apparatus in accordance with the invention.

A third embodiment related to the measuring apparatus of the present invention is basically configured likewise the first embodiment illustrated in FIG. 1 and is designed, as illustrated in FIG. 5, so that respectively negative feedback loops of the positive side limiting circuit 62 and the negative side limiting circuit 64 include the capacitors Cc1 and Cc2 independently and include buffer circuits 65A and 65B independently.

That is, the negative feedback loop of the positive side limiting circuit 62 includes an independent capacitor Cc1 and the buffer circuit 65A besides the feedback resistance R3p. One end side of the capacitor Cc1 is connected to the feedback resistance R3p and the other end side is connected to an output terminal of the buffer circuit 65A. In addition, the non-inverting input terminal of the buffer circuit 65A is connected to the cathode of the diode D1p.

In addition, the negative feedback loop of the negative side limiting circuit 64 includes an independent capacitor Cc2 and the buffer circuit 65B besides the feedback resistance R3n. One end side of the capacitor Cc2 is connected to the feedback resistance R3n and the other end side is connected to the output terminal of the buffer circuit 65B. Moreover, the non-inverting input terminal of the buffer circuit 65B is connected to the anode of the diode D1n.

Here, in the third embodiment hereof, the configuration of the other portions except the above described configuration is likewise the configuration of the first embodiment in FIG. 1. Therefore, like reference characters are caused to designate the same or similar components throughout the drawing and description of the detailed description thereon will be omitted.

According to thus configured third embodiment, since respectively negative feedback loops of the positive side limiting circuit 62 and the negative side limiting circuit 64 can be configured independently, the respective properties of the positive side limiting circuit 62 and the negative side limiting circuit 64 can be set arbitrarily based on necessity and moreover, influence of those respective properties can be excluded.

In addition, according to the thus configured third embodiment, a likewise operations and effects of the first embodiment can be realized.

Fourth Embodiment

Figure 6:
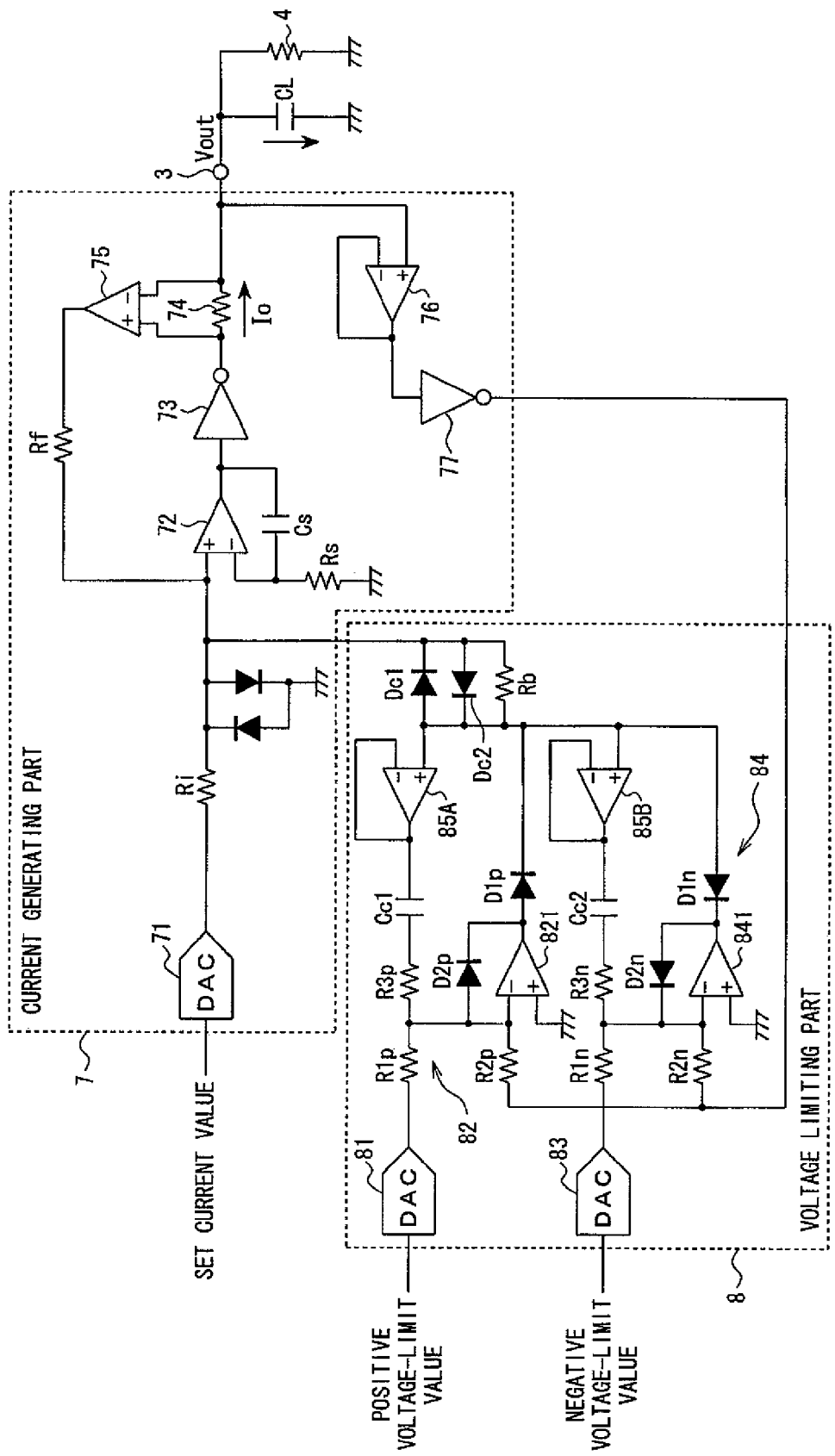
FIG. 6 is a circuit diagram illustrating a configuration of a fourth embodiment of a current measuring apparatus in accordance with the invention.

A fourth embodiment related to a measuring apparatus applies a desired current in a load being a measuring object to measure a voltage of that load at that time and comprises, as illustrated in FIG. 6, a current generating part 7 generating a current to be applied to a load 4 being a measuring object; a current generating part 7 limiting a voltage of the load 4 to a set value; and an output terminal 3 connected to the load 4.

The current generating part 7 comprises, as illustrated in FIG. 6, a D/A converter 71; a main amplifier 72; an inverter 73; a current sensing resistor 74; a differential amplifier 75; a buffer circuit 76; and an inverter 77 and the like. Here, the buffer circuit 76 and the inverter 77 configure a voltage detecting circuit detecting the output voltage Vout.

In further detailed description, the D/A converter 71 converts a set current value into an analog voltage corresponding to that value. The main amplifier 72 is configured by an operational amplifier and supplies its non-inverting input terminal with an analog voltage output from the D/A converter 71 through the resistance Ri. An inverting input terminal of the main amplifier 72 is grounded through a resistance Rs. A capacitor Cs is brought into connection between an output terminal and the inverting input terminal of the main amplifier 72.

The output terminal of the main amplifier 72 is connected to the output terminal 3 through the inverter (inverting circuit) 73 and the current sensing resistor 74. The current sensing resistor 74 detects a current Io flowing in the load 4 and its both ends are connected to an inverting input terminal and a non-inverting input terminal of the differential amplifier 75. An output terminal of the differential amplifier 75 is connected to a non-inverting input terminal of the main amplifier 72 through the feedback resistance Rf. Accordingly, the main amplifier 72 configures a negative feedback amplifier circuit.

The buffer circuit 76 detects an output voltage Vout (voltage of the load 4) of the output terminal 3. That detection voltage is inverted by the inverter 77 and is supplied to the input sides of the positive side limiting circuit 82 and the negative side limiting circuit 84 to be described later.

The voltage limiting part 8 comprises a D/A converter 81, a positive side limiting circuit 82, a D/A converter 83 and a negative side limiting circuit 84.

In further detailed description, the D/A converter 81 generates a positive voltage corresponding to a voltage-limit value to be set on the positive side to output this positive voltage.

The positive side limiting circuit 82 amplifies a voltage of a difference between the output voltage of the inverter 77 and an output voltage of the D/A converter 81; feeds this voltage to the non-inverting input terminal of the main amplifier 72 through the diode D1p and the diode Dc1; and limits a voltage of the load 4 to a positive voltage-limit value.

Therefore, the positive side limiting circuit 82 is configured, as illustrated in FIG. 6, by an operational amplifier 821; an input resistance R1p and R2p; a diode D1p; a feedback resistance R3p; a capacitor Cc1 for shielding direct currents; a buffer circuit 85A with high input impedance; and a diode Dc1. Here, in the positive side limiting circuit 82, the diode D2p can be omitted.

The inverting input terminal of the operational amplifier 821 is supplied with an output voltage of the D/A converter 81 through the input resistance R1p; and is supplied with an output voltage of the inverter 77 through the input resistance R2p. In addition, the non-inverting input terminal of the operational amplifier 821 is grounded.

An output terminal of the operational amplifier 821 is connected to a non-inverting input terminal of the main amplifier 12 through the diode D1p and the diode Dc1. In addition, an output terminal of the operational amplifier 821 is connected to an inverting input terminal of the operational amplifier 821 through the diode D1p, the buffer circuit 85A, the capacitor Cc1 and the feedback resistance R3p. Accordingly, the positive side limiting circuit 82 includes a negative feedback loop. The negative feedback loop includes a capacitor Cc1 and a buffer circuit 85A besides the feedback resistance R3p.

The D/A converter 83 generates a negative voltage corresponding to a current limitation value to be set to output this negative voltage.

The negative side limiting circuit 84 amplifies a voltage of a difference between the output voltage of the inverter 77 and an output voltage of the D/A converter 83; feeds this voltage to the non-inverting input terminal of the main amplifier 72 through the diode D1n and the diode Dc2; and limits a voltage of the load 4 to a negative voltage-limit value.

Therefore, the negative side limiting circuit 84 is configured, as illustrated in FIG. 6, by an operational amplifier 841; an input resistance R1n and R2n; a diode D1n; a feedback resistance R3n; a capacitor Cc2 for shielding direct currents; a buffer circuit 85B with high input impedance; and a diode Dc2. Here, in the negative side limiting circuit 84, the diode D2n can be omitted.

The inverting input terminal of the operational amplifier 841 is supplied with an output voltage of the D/A converter 83 through the input resistance R1n; and is supplied with an output voltage of the inverter 77 through the input resistance R2n. In addition, the non-inverting input terminal of the operational amplifier 841 is grounded.

An output terminal of the operational amplifier 841 is connected to a non-inverting input terminal of the main amplifier 72 through the diode D1n and the diode Dc2. In addition, an output terminal of the operational amplifier 841 is connected to an inverting input terminal of the operational amplifier 841 through the diode D1n, the buffer circuit 85B, the capacitor Cc2 and the feedback resistance R3n. Accordingly, the negative side limiting circuit 84 includes a negative feedback loop. The negative feedback loop includes a capacitor Cc2 and a buffer circuit 85B besides the feedback resistance R3n.

Here, the non-inverting input terminals of the buffer circuits 85A and 85B are connected to a non-inverting input terminal of the main amplifier 72 with resistance Rb made of, for example, high resistance. The resistance Rb is intended to fix potentials of the non-inverting input terminals of the buffer circuits 85A and 85B at a predetermined potential so as not to become unknown when the limiting circuits 82 and 84 do not perform limiting operations.

Next, an operation example of the thus configured fourth embodiment will be described with reference to the drawings.

At first, the case where a desired current generated by the current generating part 7 is supplied to the load 4 to measure a voltage of the load 4 will be described.

In that case, the D/A converter 71 converts a set current to an analog voltage corresponding to that value and supplies the non-inverting input terminal of the main amplifier 72 with that analog voltage. Thereby, the load current Io flows in the current sensing resistor 74 and a voltage corresponding to the load current Io appears. That voltage is amplified by the differential amplifier 75. The output voltage of the differential amplifier 75 is fed back to the inverting input terminal of the main amplifier 72 to operate so that the load current Io becomes equal to a set current.

The voltage (voltage of the output terminal 3) of the load 4 is input to the buffer circuit 76; this voltage is taken out from the buffer circuit 76; and this taken voltage is converted into a digital value with an A/D converter (not illustrated in the drawing). The digital value thereof is displayed on an indicator and the like not illustrated in the drawing as a voltage of the load 4.

Next, operations of the voltage limiting part 8 in the case where the load 4 gets open and the positive load voltage (voltage of the output terminal 3) is an overvoltage will be described.

Here, when an absolute value of a negative output voltage detected by the buffer circuit 76 and inverted by the inverter 77 gets larger than a positive output voltage of the D/A converter 81, the output voltage of the operational amplifier 821 of the positive side limiting circuit 82 becomes a positive voltage. That positive voltage is negatively fed back to the inverting input terminal of the operational amplifier 821 through the diode D1p and, moreover, through the buffer circuit 85A, the capacitor Cc1 and the negative feedback resistance R3p, and the voltage limiting part 8 operates so that the voltage of that inverting input terminal becomes zero.

A positive voltage corresponding to the difference between the output voltage of the inverter 77 and the output voltage of the D/A converter 81 appears at a common connection point of the diode D1p and the non-inverting input terminal of the buffer circuit 85A. That positive voltage is applied to the non-inverting input terminal of the main amplifier 72 through the diode Dc1. Therefore, the output voltage of the inverter 73, that is, the output voltage Vout of the output terminal 3 drops to operate so that the absolute value of the output voltage of the buffer circuit 76 is equal to the output voltage of the D/A converter 81. The load voltage is limited to a positive voltage-limit value set in the D/A converter 81.

On the other hand, in the case where a negative overvoltage appears at the output terminal 3, the negative side limiting circuit 84 operates likewise. The voltage of the output terminal 3 is limited to a negative voltage-limit value set in the D/A converter 83.

Here, with respect to the fourth embodiment, as in the first embodiment, in the case where the output voltage of the D/A converter 71 changes, the output voltage Vout of the output terminal 3 changes and the slew rate of the current generating part 7 is improved in the case where the voltage-limit value set in the voltage limiting part 8 is small.

Principles on operation such as the positive side limiting circuit 82 in that case are likewise the principles on operations of the positive side limiting circuit 62 and the like of the first embodiment. Therefore, description thereof will be omitted.

In addition, in the fourth embodiment, likewise in the case of the first embodiment, in the case where the load 4 connected to the output terminal 3 includes the capacitor CL, an improvement in slew rate is planned. Principles on operation such as the positive side limiting circuit 82 in that case are also likewise the principles on operations of the positive side limiting circuit 62 and the like of the first embodiment. Therefore, description thereof will be omitted.

Next, typical configurations of the fourth embodiment and the accompanying operations and effects will be summarized as follows.

(1) In the fourth embodiment, the positive side limiting circuit 82 and the negative side limiting circuit 84 includes the capacitors Cc1 and Cc2 for shielding direct currents inside their respective negative feedback loops. Therefore, when the output voltage Vout gives rise to a slew rate due to a change in output voltage of the D/A converter 71, the potential Vs of the non-inverting input terminal of the main amplifier 72 will not be influenced by the output voltage corresponding to the set current-limit values of the D/A converters 81 and 83. Therefore, according to the fourth embodiment, the gains of the positive side limiting circuit 82 and the negative side limiting circuit 84 can be enhanced to enable realization of faster and more accurate voltage limiting operations.

(2) In addition, in the fourth embodiment, the positive side limiting circuit 82 and the negative side limiting circuit 84 are respectively provided with buffer circuits 85A and 85B inside their respective negative feedback loops and thereby no current flows in those negative feedback loops. Therefore, according to the fourth embodiment, respective input impedances of the positive side limiting circuit 82 and the negative side limiting circuit 84 can be improved equivalently. Thereby, attenuation of the feedback amount of the current generating part 7 can be prevented. Consequently, frequency properties of the current generating part 7 are improved so that an improvement in settling property can be planned.

(3) Moreover, in the fourth embodiment, the positive side limiting circuit 82 and the negative side limiting circuit 84 respectively supply the non-inverting input terminal of the main amplifier 72 with their respective output voltages through the diodes Dc1 and Dc2. Therefore, in the fourth embodiment, during an occurrence of a slew rate, the currents (sink currents at the time of the positive voltage slew rate and source currents at the time of the negative voltage slew rate) flowing in the non-inverting input terminal of the buffer circuits 85A and 85B are prevented so that the positive side limiting circuit 82 and the negative side limiting circuit 84 do not carry out the current limiting operations. Accordingly, since the fourth embodiment does not carry out current limiting operations in the case where the voltage of the load 4 does not exceed the set voltage-limit value, voltage settling does not change but becomes the same regardless of the level of the set voltage-limit value.

(4) In addition, in the fourth embodiment, each of the negative feedback loops of the positive side limiting circuit 82 and the negative side limiting circuit 84 is configured independently. Therefore, properties of the positive side limiting circuit 82 and the negative side limiting circuit 84 can be respectively set arbitrarily according to necessity. Moreover, influence by those respective properties can be excluded.

(5) Here, in the fourth embodiment, each of the negative feedback loops of the limiting circuits 82 and 84 include the capacitors Cc1 and Cc2 and the buffer circuits 85A and 85B and, moreover, the outputs of the limiting circuits 82 and 84 are taken out through the diodes Dc1 and Dc2.

However, the present invention does not have to include all of those configurations but can preferably include at least one of those configurations or can be a combination of the capacitors Cc1 and Cc2 and the buffer circuits 85A and 85B, a combination of the capacitors Cc1 and Cc2 and the diodes Dc1 and Dc2 and the like.

The direct current measuring apparatus of the embodiments in accordance with the present invention can improve settling performance at the time of measuring the current and the like due to a set limit value of the current, and bring about speeding up and higher accuracy.

In addition, the limiting circuit of the embodiments in accordance with the present invention can contribute to realization of the above described advantages of the direct current measuring apparatus of the present invention.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A direct current measuring apparatus comprising:
   a first D/A converter outputting a voltage corresponding to a set voltage;
   a main amplifier generating the set voltage based on an output voltage of the first D/A converter to supply a load with the set voltage;
   a differential amplifier generating and outputting a voltage corresponding to a current flowing in the load;
   a second D/A converter generating and outputting a voltage corresponding to a predetermined limit current flowing in the load; and
   a limiting circuit amplifying a difference between an output voltage of the differential amplifier and an output voltage of the second D/A converter and feeding back the difference to an input side of the main amplifier through a diode,
   wherein, the limiting circuit includes a negative feedback loop including a feedback resistance and the negative feedback loop includes either a capacitor or a buffer circuit on an output side of the limiting circuit.

2. The direct current measuring apparatus according to claim 1, wherein the negative feedback loop of the limiting circuit includes both of a capacitor and a buffer circuit on an output side of the limiting circuit.

3. The direct current measuring apparatus according to claim 1, wherein the diode in the limiting circuit is configured by a first diode forming a part of the negative feedback loop and a second diode taking out an output of the limiting circuit.

4. The direct current measuring apparatus according to claim 1, further comprising a resistor between the main amplifier and the buffer circuit.

5. A direct current measuring apparatus comprising:
   a first D/A converter outputting a voltage corresponding to a set voltage;
   a main amplifier generating the set voltage based on an output voltage of the first D/A convener to supply a load with the set voltage;
   a differential amplifier generating and outputting a voltage corresponding to a current flowing in the load;
   a second D/A converter and a third D/A converter generating and outputting a positive and negative voltage corresponding to a predetermined positive and negative limit current flowing in the load;
   a first limiting circuit amplifying a difference between a positive output voltage of the differential amplifier and an output voltage of the second D/A converter and feeding back the difference to an input side of the main amplifier though a diode; and
   a second limiting circuit amplifying a difference between a negative output voltage of the differential amplifier and an output voltage of the third D/A converter and feeding back the difference to an input side of the main amplifier through a diode,
   wherein, the first and second limiting circuit includes a first and a second negative feedback loop including a feedback resistance and the respective negative feedback loops include either a common capacitor or a common buffer circuit on an output side of each of the limiting circuits.

6. The direct current measuring apparatus according to claim 5, wherein:
the diode in the first limiting circuit is configured by a first diode forming a part of the first negative feedback loop and a second diode taking out an output of the first limiting circuit;
the diode in the second limiting circuit is configured by a third diode forming a part of the second negative feedback loop and a fourth diode taking out an output of the second limiting circuit; and
the third and the fourth diode are used in common.

7. The direct current measuring apparatus according to claim 5, further comprising a resistor between the main amplifier and the buffer circuit.

8. A direct current measuring apparatus comprising:
a first D/A converter outputting a voltage corresponding to a set voltage;
a main amplifier generating the set voltage based on an output voltage of the first D/A converter to supply a load with the set voltage;
a differential amplifier generating and outputting a voltage corresponding to a current flowing in the load;
a second D/A converter and a third D/A converter generating and outputting a positive and negative voltage corresponding to a predetermined positive and negative limit current flowing in the load;
a first limiting circuit amplifying a difference between a positive output voltage of the differential amplifier and an output voltage of the second D/A converter and feeding back the difference to an input side of the main amplifier through a diode; and
a second limiting circuit amplifying a difference between a negative output voltage of the differential amplifier and an output voltage of the third D/A converter and feeding back the difference to an input side of the main amplifier through a diode,
wherein, the first and second limiting circuit includes a first and a second negative feedback loop including a feedback resistance; and the respective negative feedback loops include either an independent capacitor or an independent buffer circuit on an output side of each of the limiting circuits or include both of an independent capacitor and an independent buffer circuit on an output side of each of the limiting circuits.

9. The direct current measuring apparatus according to claim 8, wherein:
the diode in the first limiting circuit is configured by a first diode forming a part of the first negative feedback loop and a second diode taking out an output of the first limiting circuit;
the diode in the second limiting circuit is configured by a third diode forming a part of the second negative feedback loop and a fourth diode taking out an output of the second limiting circuit; and
the third and the fourth diode are used in common.

10. The direct current measuring apparatus according to claim 8, further comprising a resistor between the main amplifier and the buffer circuit.

11. A direct current measuring apparatus comprising:
a first D/A converter outputting a voltage corresponding to a set voltage;
a main amplifier generating the set voltage based on an output voltage of the first D/A converter to supply a load with the set voltage;
a voltage detecting circuit detecting a voltage of the load;
a second D/A converter generating and outputting a predetermined limit voltage supplied to the load; and
a limiting circuit amplifying a difference between a detection of the voltage detecting circuit and an output voltage of the second D/A converter and feeding back the difference to an input side of the main amplifier through a diode,
wherein the limiting circuit includes a negative feedback loop including a feedback resistance and the negative feedback loop includes either a capacitor or a buffer circuit on an output side of the limiting circuit.

12. The direct current measuring apparatus according to claim 11, wherein a negative feedback loop of the limiting circuit includes both of a capacitor and a buffer circuit on an output side of the limiting circuit.

13. The direct current measuring apparatus according to claim 11, wherein the diode in the limiting circuit is configured by a first diode forming a part of the negative feedback loop and a second diode taking out an output of the limiting circuit.

14. The direct current measuring apparatus according to claim 11, further comprising a resistor between the main amplifier and the buffer circuit.

15. A direct current measuring apparatus comprising:
a first D/A converter outputting a voltage corresponding to a set voltage;
a main amplifier generating the set voltage based on an output voltage of the first D/A converter to supply a load with the set voltage;
a voltage detecting circuit detecting a voltage of the load;
a second D/A converter and a third D/A converter respectively generating and outputting a positive and negative voltage as a predetermined limit voltage supplied to the load;
a first limiting circuit amplifying a difference between a detection of the voltage detecting circuit and a positive output voltage of the second D/A converter and feeding back the difference to an input side of the main amplifier through a diode; and
a second limiting circuit amplifying a difference between a detection of the voltage detecting circuit and a negative output voltage of the third D/A converter and feeding back the difference to an input side of the main amplifier through a diode,
wherein, the first and second limiting circuit includes a first and a second negative feedback loop including a feedback resistance and the respective negative feedback loops include either a common capacitor or a common buffer circuit on an output side of each of the limiting circuits.

16. The direct current measuring apparatus according to claim 15, wherein
the diode in the first limiting circuit is configured by a first diode forming a part of the first negative feedback loop and a second diode taking out an output of the first limiting circuit;
the diode in the second limiting circuit is configured by a third diode forming a part of the second negative feedback loop and a fourth diode taking out an output of the second limiting circuit; and
the third and the fourth diode are used in common.

17. The direct current measuring apparatus according to claim 15, further comprising a resistor between the main amplifier and the buffer circuit.

18. A direct current measuring apparatus comprising:
a first D/A converter outputting a voltage corresponding to a set voltage;

a main amplifier generating the set voltage based on an output voltage of the first D/A converter to supply a load with the set voltage;

a voltage detecting circuit detecting a voltage of the load;

a second D/A converter and a third D/A converter respectively generating and outputting a positive and negative voltage as a predetermined limit voltage supplied to the load;

a first limiting circuit amplifying a difference between a detection of the voltage detecting circuit and a positive output voltage of the second D/A converter and feeding back the difference to an input side of the main amplifier through a diode; and a second limiting circuit amplifying a difference between a detection of the voltage detecting circuit and a negative output voltage of the third D/A converter and feeding back the difference to an input side of the main amplifier through a diode, wherein, the first and second limiting circuit includes a first and a second negative feedback loop including a feedback resistance; and the respective negative feedback loops include either an independent capacitor or an independent buffer circuit on an output side of each of the limiting circuits or include both of an independent capacitor and an independent buffer circuit on an output side of each of the limiting circuits.

19. The direct current measuring apparatus according to claim 18, wherein the diode in the first limiting circuit is configured by a first diode forming a part of the first negative feedback loop and a second diode taking out an output of the first limiting circuit;

the diode in the second limiting circuit is configured by a third diode forming a part of the second negative feedback loop and a fourth diode taking out an output of the second limiting circuit; and the third and the fourth diode are used in common.

20. The direct current measuring apparatus according to claim 18, further comprising a resistor between the main amplifier and the buffer circuit.

21. A limiting circuit used in a current measuring apparatus applying a predetermined voltage to a load to measure a current of the load, comprising:

an operational amplifier; and a negative feedback loop provided between an output terminal of the operational amplifier and a non-inverting input terminal and including a first diode and feedback resistance, wherein a limit voltage corresponding to a limit current of the load and a detection voltage obtained corresponding to a current flowing in the load are input to the operational amplifier, and wherein the negative feedback loop includes either a capacitor or a buffer circuit on an output side of the operational amplifier.

22. The limiting circuit according to claim 21, wherein the negative feedback loop includes both of a capacitor and a buffer circuit on an output side of the operational amplifier.

23. The limiting circuit according to claim 21, wherein an output of the operational amplifier is taken out through a second diode.

24. The limiting circuit according to claim 21, further comprising a resistor connected to an input of the buffer circuit.

* * * * *

UNITED STATES PATENT AND TRADEMARK OFFICE
CERTIFICATE OF CORRECTION

PATENT NO. : 7,446,554 B2  Page 1 of 1
APPLICATION NO. : 11/939947
DATED : November 4, 2008
INVENTOR(S) : Satoshi Kodera It is certified that error appears in the above-identified patent and that said Letters Patent is hereby corrected as shown below:

In the Claims:

In Claim 5, column 18, line 44, the word "converner" should be --converter--.

In Claim 5, column 18, line 56, the word "though" should be --through--.

Signed and Sealed this

Twenty-seventh Day of January, 2009

JOHN DOLL
*Acting Director of the United States Patent and Trademark Office*